United States Patent
Bogen et al.

(10) Patent No.: US 12,362,312 B2
(45) Date of Patent: Jul. 15, 2025

(54) POWER SEMICONDUCTOR MODULE HAVING A SUBSTRATE ARRANGEMENT, HAVING POWER SEMICONDUCTOR COMPONENTS AND HAVING A FOIL STACK ARRANGEMENT

(71) Applicant: SEMIKRON ELEKTRONIK GMBH & CO. KG, Nuremberg (DE)

(72) Inventors: Ingo Bogen, Nuremberg (DE); Stefan Oehling, Uttenreuth (DE)

(73) Assignee: SEMIKRON ELEKTRONIK GMBH & CO. KG, Nuremberg (DE)

( * ) Notice: Subject to any disclaimer, the term of this patent is extended or adjusted under 35 U.S.C. 154(b) by 503 days.

(21) Appl. No.: 17/902,629

(22) Filed: Sep. 2, 2022

(65) Prior Publication Data
US 2024/0079367 A1 Mar. 7, 2024

(30) Foreign Application Priority Data
Sep. 13, 2021 (DE) .................. 10 2021 123 636.3

(51) Int. Cl.
*H01L 23/00* (2006.01)
*H01L 23/373* (2006.01)
*H01L 25/07* (2006.01)

(52) U.S. Cl.
CPC .......... *H01L 24/40* (2013.01); *H01L 23/3735* (2013.01); *H01L 24/32* (2013.01);
(Continued)

(58) Field of Classification Search
None
See application file for complete search history.

(56) References Cited

U.S. PATENT DOCUMENTS

2010/0090328 A1* 4/2010 Goebl .................. H01L 24/83
257/E21.501
2019/0020285 A1* 1/2019 Kobolla ............... H05K 1/0209

FOREIGN PATENT DOCUMENTS

DE 102005039278 A1 * 2/2007 .......... H01L 25/072
DE 102017115883 A1 1/2019

OTHER PUBLICATIONS

DE102021123636B4—Claims and COT dated May 20, 2022—2 pages—English; 11 pages—German.
(Continued)

*Primary Examiner* — Michelle Mandala
*Assistant Examiner* — Jordan M Klein
(74) *Attorney, Agent, or Firm* — Andrew F. Young, Esq; NOLTE LACKENBACH SIEGEL

(57) ABSTRACT

A power semiconductor module has a substrate arrangement which has a substrate, wherein the respective substrate has conductor tracks, power semiconductor components arranged on the substrate conductor tracks and electrically conductively contacted therewith, a foil stack arrangement which has at least one foil stack, and the foil stack comprises foil stack conductor tracks. The power semiconductor components are electrically conductively connected to by the substrate conductor tracks and the foil stack conductor tracks to form a circuit, and having an electrically conductive bridging element which has first and second contact sections extending from the foil stack arrangement and a connecting section which connects the first and second contact sections, the first contact section is electrically conductively contacted with a first substrate conductor track or with a foil stack conductor track, and the second contact section is electrically conductively contacted with a second substrate conductor track or with a foil stack conductor track, the bridging element is electrically connected in
(Continued)

parallel with at least one section of a foil stack conductor track of the foil stack.

10 Claims, 3 Drawing Sheets

(52) U.S. Cl.
CPC ............ *H01L 24/73* (2013.01); *H01L 25/072* (2013.01); *H01L 2224/32225* (2013.01); *H01L 2224/40139* (2013.01); *H01L 2224/40225* (2013.01); *H01L 2224/73263* (2013.01)

(56) References Cited

OTHER PUBLICATIONS

DE102021123636B4—Examination Report dated Apr. 7, 2022, 4 pages—German, 4 pages—English.
DE102021123636B4—Amended Claims with small corrections in Claim 1 dated Mar. 20, 2022, 9 pages—German, 2 pages—English.
DE102021123636B4—Decision to Grant dated Oct. 19, 2023, 4 pages—German, 4 pages—English.
DE 10 2021 123 636.3, Examination Report dated Apr. 7, 2022, 4 pages—German, 4 pages—English.

* cited by examiner

POWER SEMICONDUCTOR MODULE HAVING A SUBSTRATE ARRANGEMENT, HAVING POWER SEMICONDUCTOR COMPONENTS AND HAVING A FOIL STACK ARRANGEMENT

CROSS REFERENCE TO RELATED APPLICATIONS

This application relates to and claims priority to DE 10 2021 123 636.3 filed Sep. 13, 2022, the entire contents of which are incorporated herein fully by reference.

FIGURE SELECTED FOR PUBLICATION

FIG. 1.

BACKGROUND OF THE INVENTION

Field of the Invention

The invention relates to a power semiconductor module having a substrate arrangement, having power semiconductor components and having a foil stack arrangement.

Description of the Related Art

DE 10 2017 115 883 A1 discloses a power semiconductor module having a substrate arrangement, having power semiconductor components and having a foil stack arrangement. The power semiconductor components are electrically conductively connected to one another by means of substrate conductor tracks of the substrate arrangement and foil stack conductor tracks of the foil stack arrangement so as to form a circuit.

A disadvantage in this case is that when a large current flows through at least one of the foil stack conductor tracks of the foil stack arrangement, this may lead to strong heating of the at least one conductor track in question. The heating of this at least one conductor track may lead to a heat input into power semiconductor components arranged in the immediate vicinity of this at least one conductor track, so that they can only be operated with a reduced electrical power.

DE 10 2005 039 278 A1 discloses a power semiconductor module having a power component which electrically conductively connects to one another two conductor tracks of different substrates of the power semiconductor module, which are arranged on the substrates.

ASPECTS AND OBJECTS OF THE INVENTION

It is an object of the invention to provide a power semiconductor module having a substrate arrangement, having power semiconductor components and having a foil stack arrangement, in which the heat input from the foil stack arrangement in to at least one power semiconductor component is reduced.

This object is achieved by a power semiconductor module having a substrate arrangement which comprises at least one substrate, wherein the respective substrate comprises an electrically nonconductive insulating layer and substrate conductor tracks arranged on the insulating layer, having power semiconductor components arranged on the substrate conductor tracks of the substrate arrangement and electrically conductively contacted therewith, having a foil stack arrangement which comprises at least one foil stack, wherein the respective foil stack comprises a first and second electrically conductive foil structured to form foil stack conductor tracks, and an electrically nonconductive insulating foil arranged between the first and second electrically conductive foil, wherein the power semiconductor components are electrically conductively connected to one another by means of the substrate conductor tracks of the substrate arrangement and the foil stack conductor tracks of the foil stack arrangement so as to form a circuit, and having an electrically conductive bridging element which comprises a first and second contact section extending away from the foil stack arrangement and a connecting section which electrically conductively connects the first and second contact sections to one another, wherein the first contact section is electrically conductively contacted with a first substrate conductor track of the substrate arrangement or with a foil stack conductor track of the foil stack arrangement, and the second contact section is electrically conductively contacted with a second substrate conductor track of the substrate arrangement or with a foil stack conductor track of the foil stack arrangement, wherein the bridging element is electrically connected in parallel with at least one section of a foil stack conductor track of the foil stack arrangement.

It has been found to be advantageous for the bridging element to be configured as a metal sheet. In this way, the bridging element has a low inductance and is economically producible.

It has furthermore been found to be advantageous for the connecting section to have a thickness of from 150 μm to 1000 μm, in particular of preferably from 500 μm to 750 μm. In this way, the bridging element has a particularly low inductance.

It has furthermore been found to be advantageous for the connecting section to be formed in one piece with the first and second contact sections. In this way, the bridging element can be produced particularly economically.

It has furthermore been found to be advantageous for the power semiconductor module to comprise a load terminal element for electrically conductive connection to an external element, the load terminal element being formed in one piece with the bridging element. In this way, the load terminal element can be produced particularly economically together with the bridging element.

In this context, it has been found to be advantageous for the load terminal element to be configured as a DC potential load terminal element, which has a DC potential during operation of the power semiconductor module. A large current often flows through a DC potential load terminal element, so that a part of this current flows via the bridging element.

It has furthermore been found to be advantageous for the first contact section to be arranged in the vicinity of the load terminal element and for it to be electrically conductively connected to the load terminal element. Because of the short distance between the first contact section and the load terminal element, the first contact section is electrically conductively connected with a low inductance to the load terminal element.

It has further been found to be advantageous for the first contact section to be arranged in an edge region of the substrate arrangement. In this way, a current can be transferred from an arbitrary position of the substrate arrangement, in particular from a central region of the substrate arrangement, to the edge region of the substrate arrangement via the bridging element.

It has furthermore been found to be advantageous for the first contact section to be electrically conductively contacted with a first substrate conductor track of the substrate arrangement or with a particular foil stack conductor track of the foil stack arrangement, and for the second contact section to be electrically conductively contacted with a second substrate conductor track of the substrate arrangement or with the particular foil stack conductor track of the foil stack arrangement, the bridging element being electrically connected in parallel at least with one section of the particular foil stack conductor track of the foil stack arrangement. In this way, the section of the particular foil stack conductor track can be bridged with a particularly low inductance by means of the bridging element.

It has further been found to be advantageous for the substrate arrangement to be arranged on a baseplate of the power semiconductor module or on a heat sink of the power semiconductor module. In this way, the heat generated in the power semiconductor components during their operation can be dissipated efficiently.

According to another aspect of the present invention there is provided power semiconductor module has a substrate arrangement which has a substrate, wherein the respective substrate has conductor tracks, power semiconductor components arranged on the substrate conductor tracks and electrically conductively contacted therewith, a foil stack arrangement which has at least one foil stack, and the foil stack comprises foil stack conductor tracks. The power semiconductor components are electrically conductively connected to by the substrate conductor tracks and the foil stack conductor tracks to form a circuit, and having an electrically conductive bridging element which has first and second contact sections extending from the foil stack arrangement and a connecting section which connects the first and second contact sections, the first contact section is electrically conductively contacted with a first substrate conductor track or with a foil stack conductor track, and the second contact section is electrically conductively contacted with a second substrate conductor track or with a foil stack conductor track, the bridging element is electrically connected in parallel with at least one section of a foil stack conductor track of the foil stack.

The above and other aspects, features, objects, and advantages of the present invention will become apparent from the following description read in conjunction with the accompanying drawings, in which like reference numerals designate the same elements.

DETAILED DESCRIPTION OF THE PREFERRED EMBODIMENTS

Figure 1:
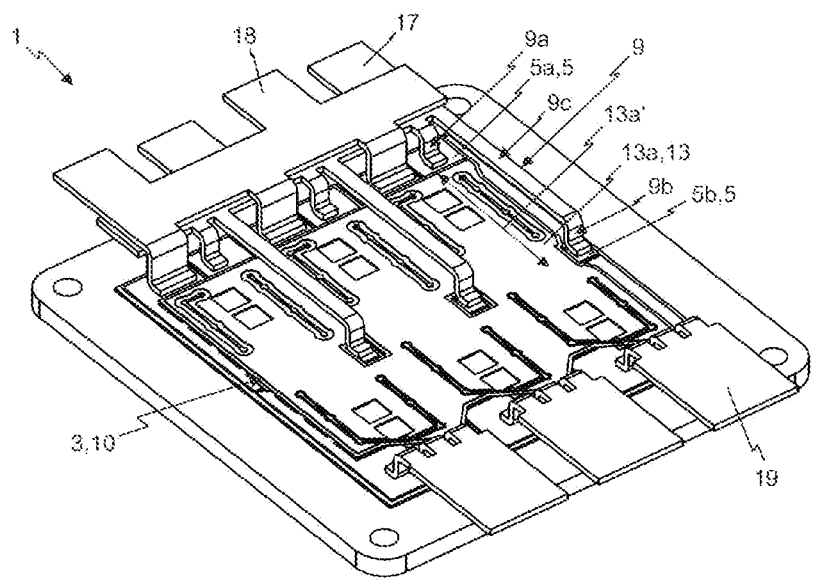
FIG. 1 shows a perspective view of a power semiconductor module according to the invention.

Reference will now be made in detail to embodiments of the invention. Wherever possible, same or similar reference numerals are used in the drawings and the description to refer to the same or like parts or steps. The drawings are in simplified form and are not to precise scale. The word 'couple' and similar terms do not necessarily denote direct and immediate connections, but also include connections through intermediate elements or devices. For purposes of convenience and clarity only, directional (up/down etc.) or motional (forward/back, etc.) terms may be used with respect to the drawings. These and similar directional terms should not be construed to limit the scope in any manner. It will also be understood that other embodiments may be utilized without departing from the scope of the present invention, and that the detailed description is not to be taken in a limiting sense, and that elements may be differently positioned, or otherwise noted as in the appended claims without requirements of the written description being required thereto.

Figure 2:
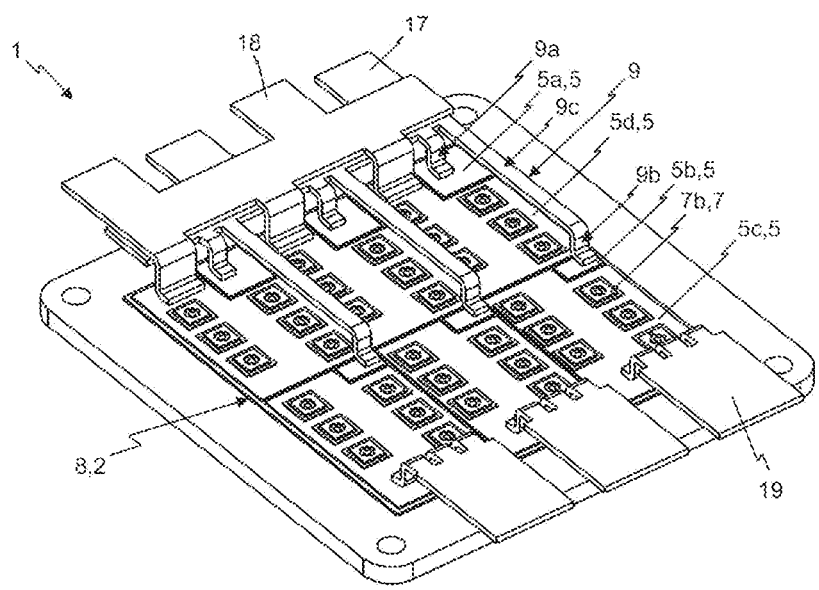
FIG. 2 shows a perspective view of a power semiconductor module according to the invention, a foil stack arrangement of the power semiconductor module not being represented.
Figure 3:
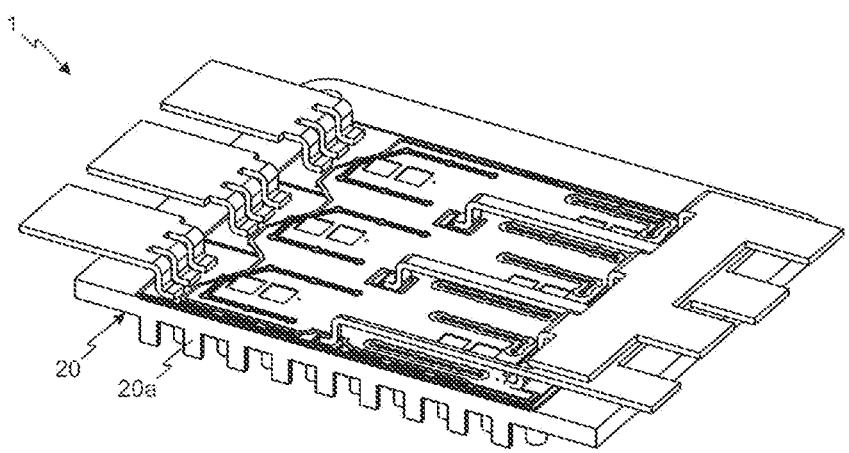
FIG. 3 shows a perspective sectional view of a power semiconductor module according to the invention.
Figure 4:
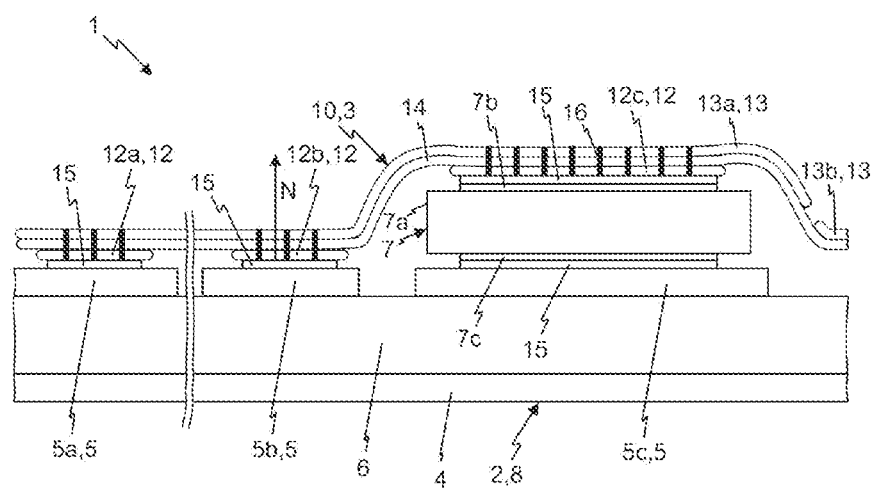
FIG. 4 shows a schematic sectional view of a region of a power semiconductor module according to the invention.
Figure 5:
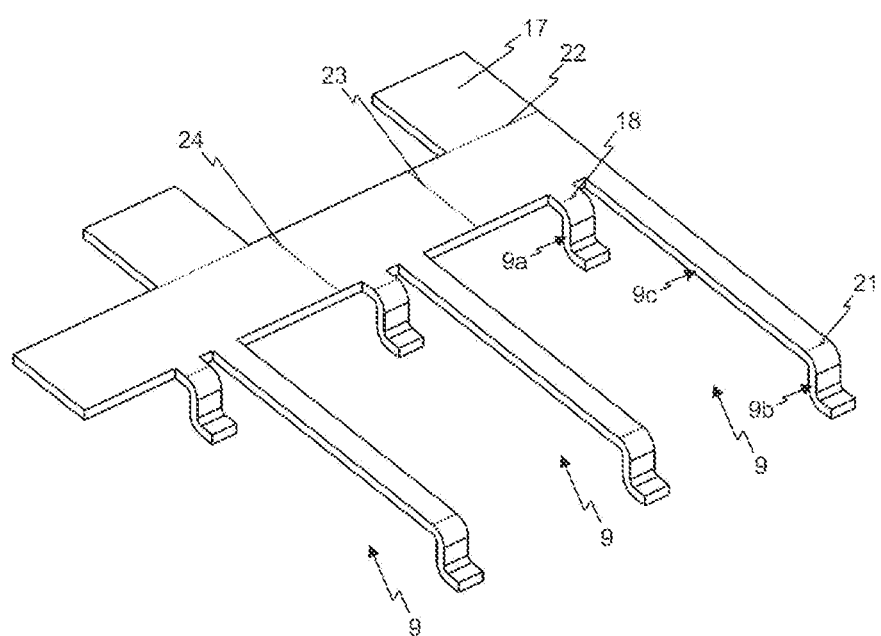
FIG. 5 shows a perspective view of a plurality of bridging elements of a power semiconductor module according to the invention.

FIG. 1 and FIG. 2 respectively represent a perspective view of a power semiconductor module 1 according to the invention, a foil stack arrangement 3 of the power semiconductor module 1 not being represented in FIG. 2. A perspective sectional view of the power semiconductor module 1 according to the invention is represented in FIG. 3, and a schematic sectional view of a region of the power semiconductor module 1 according to the invention is represented in FIG. 4. A perspective view of a plurality of bridging elements 9 of the power semiconductor module 1 according to the invention is represented in FIG. 5.

The power semiconductor module 1 according to the invention comprises a substrate arrangement 8, which comprises at least one substrate 2, here an individual substrate 2, the respective substrate 2 comprising an electrically non-conductive insulating layer 6 and substrate conductor tracks 5b, 5b, 5c and 5d arranged on the insulating layer 6. The substrate conductor tracks 5b, 5b, c and 5d are formed by a structured metal layer 5 arranged on the insulating layer 6. Preferably, the respective substrate 5 comprises an electrically conductive, preferably unstructured further metal layer 4, the insulating layer 6 being arranged between the metal layer 5 and the further metal layer 4. The insulating layer 6 may, for example, be configured as a ceramic plate. The respective substrate 5 may be configured for example as a direct copper bonded substrate (DCB substrate), as an active metal brazing substrate (AMB substrate) or as an insulated metal substrate (MS).

The power semiconductor module 1 furthermore comprises power semiconductor components 7 arranged on the substrate conductor tracks 5c and 5d of the substrate arrangement 8 and electrically conductively contacted therewith. The respective power semiconductor component 7 comprises a semiconductor body 7a, a front-side terminal metallisation 7b and a backside terminal metallisation 7c (see FIG. 4). The respective power semiconductor component 7 is electrically conductively contacted by means of a respective connecting layer 15, which may for example be configured as a solder layer or sinter layer, with a substrate conductor track 5c or 5d assigned to the respective power semiconductor component 7.

The respective power semiconductor component 7 is preferably in the form of a power semiconductor switch or a diode. The power semiconductor switches are in this case generally in the form of transistors, for example IGBTs (Insulated Gate Bipolar Transistor) or MOSFETs (Metal Oxide Semiconductor Field-Effect Transistor), or in the form of thyristors.

The power semiconductor module 1 furthermore comprises a foil stack arrangement 3, which comprises at least one foil stack 10, here an individual foil stack 10, the respective foil stack 10 comprising a first and second electrically conductive foil 12 and 13 structured to form foil stack conductor tracks 12a, 12b, 12c, 13a, 13b and an electrically nonconductive insulating foil 14 arranged between the first and second electrically conductive foils 12 and 13. In particular, the foil stack conductor tracks 12a, 12b and 12c which face the substrate arrangement 8 may also be present merely in the form of contact sections for electrical contacting of the foil stack arrangement 3. The electrically conductive first and second foils 12 and 13, or their foil stack conductor tracks, are preferably electrically conductively connected to one another by electrically conductive through-contacts 16 extending through the insulating foil 14. The power semiconductor components 7 are electrically conductively connected to one another by means of the substrate conductor tracks of the substrate arrangement 8 and the foil stack conductor tracks of the foil stack arrangement 3 so as to form a circuit, here so as to form three half-bridge circuits electrically interconnected with one another in parallel. The respective foil stack conductor tracks 12a, 12b or 12c facing toward the substrate arrangement 8 are electrically conductively contacted by means of a respective connecting layer 15, which may for example be configured as a solder layer or sinter layer, to a power semiconductor component 7 assigned to the respective foil stack conductor track and/or to a substrate conductor track 5a or 5b assigned to the respective foil stack conductor track.

The power semiconductor module 1 furthermore comprises an electrically conductive bridging element 9, which comprises a first and second contact section 9a and 9b extending away from the foil stack arrangement 3 and a connecting section 9c, which electrically conductively connects the first and second contact sections 9a and 9b to one another. In FIG. 5, a virtual boundary between the first contact section 9a and the connecting section 9c is represented by means of a dotted line 18, and a virtual boundary between the second contact section 9b and the connecting section 9c is represented by means of a dotted line 21.

In the scope of the exemplary embodiment, the power semiconductor module 1 comprises a plurality of bridging elements 9. The bridging elements 9 may, as in the exemplary embodiment, be electrically conductively connected to one another, and in particular the bridging elements 9 may be formed in one piece with one another. In FIG. 5, virtual boundaries between the bridging elements 9 are represented by means of dotted lines 23 and 24.

The first contact section 9a is, as in the exemplary embodiment, electrically conductively contacted with a first substrate conductor track 5a of the substrate arrangement 8 or with a foil stack conductor track of the foil stack arrangement 3. The second contact section 9b is, as in the exemplary embodiment, electrically conductively contacted with a second substrate conductor track 5b of the substrate arrangement 8 or with a foil stack conductor track of the foil stack arrangement 3. The bridging element 9 is electrically connected in parallel at least with a section 13a' of a foil stack conductor track 13a of the foil stack arrangement 3. The respective electrically conductive contacting of the bridging elements 9 with the substrate arrangement S or with the foil stack arrangement 3 may, for example, be configured as a welded, soldered or sintered connection. It should in this case be noted that the foil conductor track which is electrically conductively contacted with the first contact section 9a, and the foil conductor track which is electrically conductively contacted with the second contact section 9b, and the foil conductor track for which the bridging element 9 is electrically connected in parallel at least with a section of this foil conductor track, may be up to three different foil conductor tracks. However, it is preferably one and the same foil conductor track so that preferably the first contact section 9a is electrically conductively contacted with a first substrate conductor track 5a of the substrate arrangement 8 or with a particular foil stack conductor track 13a of the foil stack arrangement 3, and the second contact section 9b is electrically conductively contacted with a second substrate conductor track 5b of the substrate arrangement S or with the particular foil stack conductor track 13a of the foil stack arrangement 3, the bridging element 9 being electrically connected in parallel at least with a section 13a' of the particular foil stack conductor track 13a of the foil stack arrangement 3.

Without the bridging element 9, a relatively large load current flowing through the section 13a' of the foil stack conductor track 13a would lead to strong heating of the foil stack conductor track 13a and therefore to a heat input into the immediate vicinity of the foil stack conductor track 13a, particularly into power semiconductor components 7 arranged flush with the foil stack conductor track 13a below the foil stack conductor track 13a, so that they can be operated only with a reduced electrical power. Because of the bridging element 9, a part of the load current flows no longer through the section 13a' of the foil stack conductor track 13a but through the bridging element 9, so that the foil stack conductor track 13a is heated less and the heat input into power semiconductor components 7 arranged in the immediate vicinity of the foil stack conductor track 13a is therefore reduced, so that they can be operated with a higher electrical power, that is to say higher electrical losses can occur in these power semiconductor components without overheating of these power semiconductor components taking place.

The bridging element 9 is preferably configured as a metal sheet. The connecting section 9c preferably has a thickness of from 150 µm to 1000 µm, in particular of preferably from 500 µm to 750 µm.

The connecting section 9c is preferably formed in one piece with the first and second contact sections 9a and 9b.

The power semiconductor module 1 preferably comprises a load terminal element 17 for electrically conductive connection to an external element the load terminal element 17 being formed in one piece with the bridging element 9.

The power semiconductor module 1 preferably comprises a further load terminal element 18 for electrically conductive connection to a further external element. During operation of the power semiconductor module 1, the first load terminal element 17 preferably has a first electrical polarity and the further load terminal element 18 preferably has a second electrical polarity. The first polarity may be positive and the second polarity may be negative, or vice versa. The load terminal element 17 or respectively the further load terminal element 18 is preferably configured as a DC potential load terminal element, in such a way that it has a DC potential during operation of the power semiconductor module 1.

The first contact section 9a is preferably arranged in the vicinity of the load terminal element 17 and electrically conductively connected to the load terminal element. The first contact section 9a is preferably arranged in an edge region of the substrate arrangement 8.

The power semiconductor module 1 preferably comprises yet another further load terminal element 19, which preferably has an alternating electrical polarity during operation of the power semiconductor module 1, for electrically conductive connection to yet another further external element. The load terminal element 19 is configured as an AC potential load terminal element, in such a way that it has an AC potential during operation of the power semiconductor module 1. In the scope of the exemplary embodiment, the power semiconductor module 1 comprises a plurality of load terminal elements 19.

In the scope of the exemplary embodiment, the substrate arrangement 8, as represented by way of example in FIG. 3, is arranged on a heat sink 20 of the power semiconductor module 1. The heat sink 20 preferably comprises cooling pins 20a or cooling fins. As an alternative, the substrate arrangement 8 may be arranged on a baseplate of the power semiconductor module 1. The baseplate is preferably intended for arrangement on a heat sink.

Also, the inventors intend that only those claims which use the specific and exact phrase "means for" are intended to be interpreted under 35 USC 112. The structure herein is noted and well supported in the entire disclosure. Moreover, no limitations from the specification are intended to be read into any claims, unless those limitations are expressly included in the claims.

Having described at least one of the preferred embodiments of the present invention with reference to the accompanying drawings, it will be apparent to those skills that the invention is not limited to those precise embodiments, and that various modifications and variations can be made in the presently disclosed system without departing from the scope or spirit of the invention. Thus, it is intended that the present disclosure cover modifications and variations of this disclosure provided they come within the scope of the appended claims and their equivalents.

What is claimed is:

1. A power semiconductor module, comprising:
   a substrate arrangement which further comprises at least one substrate;
      each respective said substrate has an electrically non-conductive insulating layer and substrate conductor tracks arranged on the insulating layer, having power semiconductor components arranged on the substrate conductor tracks of the substrate arrangement and electrically conductively contacted therewith;
   a foil stack arrangement which further has at least one foil stack;
      each respective said foil stack has a first and second electrically conductive foil structured to form foil stack conductor tracks, and an electrically nonconductive insulating foil arranged between the first and second electrically conductive foil;
   wherein the power semiconductor components are electrically conductively connected to one another by means of the substrate conductor tracks of the substrate arrangement and the foil stack conductor tracks of the foil stack arrangement so as to form a circuit;
   an electrically conductive bridging element having a first and a second contact section extending away from the foil stack arrangement and a connecting section which electrically conductively connects the first and second contact section to one another;
   the first contact section is electrically conductively contacted with a first substrate conductor track of the substrate arrangement or with a foil stack conductor track of the foil stack arrangement;
   the second contact section is electrically conductively contacted with a second substrate conductor track of the substrate arrangement or with a foil stack conductor track of the foil stack arrangement;
      the bridging element is electrically connected in parallel with at least one section of a foil stack conductor track of the foil stack arrangement.

2. The power semiconductor module, according to claim 1, wherein:
   the bridging element is configured as a metal sheet.

3. The power semiconductor module, according to claim 2, wherein:
   the connecting section has a thickness of from 150 μm to 1000 μm.

4. The power semiconductor module, according to claim 3, wherein:
   the connecting section is formed in one piece with the first and second contact sections.

5. The power semiconductor module, according to claim 4, wherein:
   the power semiconductor module further comprises:
      a load terminal element for electrically conductive connection to an external element, the load terminal element being formed in one piece with the bridging element.

6. The power semiconductor module, according to claim 5, wherein:
   the load terminal element is configured as a DC potential load terminal element, which has a DC potential during operation of the power semiconductor module.

7. The power semiconductor module, according to claim 6, wherein:
   the first contact section is arranged in an edge region of the substrate arrangement.

8. The power semiconductor module, according to claim 5, wherein:
   the first contact section is arranged in the vicinity of the load terminal element and is electrically conductively connected to the load terminal element.

9. The power semiconductor module, according to claim 5, wherein:
   the first contact section is electrically conductively contacted with a first substrate conductor track of the substrate arrangement or with a particular foil stack conductor track of the foil stack arrangement;
   the second contact section is electrically conductively contacted with a second substrate conductor track of the substrate arrangement or with the particular foil stack conductor track of the foil stack arrangement; and
   the bridging element being electrically connected in parallel at least with one section of the particular foil stack conductor track of the foil stack arrangement.

10. The power semiconductor module, according to claim 9, wherein
    the substrate arrangement is arranged on a baseplate of the power semiconductor module or on a heat sink of the power semiconductor module.

* * * * *